United States Patent
Thompson et al.

(10) Patent No.: US 8,158,972 B2
(45) Date of Patent: Apr. 17, 2012

(54) ORGANIC PHOTOSENSITIVE OPTOELECTRONIC DEVICES CONTAINING TETRA-AZAPORPHYRINS

(75) Inventors: Mark E. Thompson, Anaheim, CA (US); Stephen R. Forrest, Ann Arbor, MI (US); Elizabeth Mayo, San Jose, CA (US); Kristin L. Mutolo Martinez, Gilbert, AZ (US); Rhonda F. Bailey-Salzman, San Ramon, CA (US)

(73) Assignees: The University of Southern California, Los Angeles, CA (US); The Regents of the University of Michigan, Ann Arbor, MI (US)

( * ) Notice: Subject to any disclaimer, the term of this patent is extended or adjusted under 35 U.S.C. 154(b) by 529 days.

(21) Appl. No.: 12/249,920

(22) Filed: Oct. 11, 2008

(65) Prior Publication Data

US 2009/0256141 A1  Oct. 15, 2009

Related U.S. Application Data

(60) Provisional application No. 60/960,769, filed on Oct. 12, 2007.

(51) Int. Cl.
*H01L 51/00* (2006.01)
*H01L 29/08* (2006.01)
*H01L 35/24* (2006.01)

(52) U.S. Cl. ............... 257/40; 257/E51.006; 438/99
(58) Field of Classification Search ............ 257/40, 257/E51.006; 438/99
See application file for complete search history.

(56) References Cited

U.S. PATENT DOCUMENTS

| | | | | |
|---|---|---|---|---|
| 4,731,312 A * | 3/1988 | Kato et al. | | 430/31 |
| 4,898,799 A * | 2/1990 | Fujimaki et al. | | 430/58.65 |
| 5,200,481 A * | 4/1993 | Sounik et al. | | 526/259 |
| 5,322,760 A * | 6/1994 | Itoh et al. | | 430/270.1 |
| 5,675,001 A * | 10/1997 | Hoffman et al. | | 540/121 |
| 5,876,889 A * | 3/1999 | Nakamura et al. | | 430/59.4 |
| 5,912,341 A * | 6/1999 | Hoffman et al. | | 540/121 |
| 6,068,956 A * | 5/2000 | Namba et al. | | 430/58.3 |
| 6,074,792 A * | 6/2000 | Namba et al. | | 430/59.1 |
| 6,307,147 B1 | 10/2001 | Bird et al. | | |
| 6,352,777 B1 | 3/2002 | Bulovic et al. | | |
| 6,361,885 B1 * | 3/2002 | Chou | | 428/690 |
| 6,451,415 B1 | 9/2002 | Forrest et al. | | |
| 6,580,027 B2 | 6/2003 | Forrest et al. | | |
| 6,657,378 B2 | 12/2003 | Forrest et al. | | |

(Continued)

FOREIGN PATENT DOCUMENTS

EP 1359629 A 11/2003

(Continued)

OTHER PUBLICATIONS

Exciton diffusion and dissociation in a poly(p-phenylenevinylene)/C.sub.60 heterojuction photovoltaic cell, J.J.M. Halls, K. Pichler, and R.H. Friend, S.C. Moratti and A.B. Holmes, pp. 3120-3122, Appl. Phys. Lett. 68(22), May 27, 1996.*

(Continued)

*Primary Examiner* — Kiesha Bryant
*Assistant Examiner* — Igwe U Anya
(74) *Attorney, Agent, or Firm* — Finnegan, Henderson, Farabow, Garrett & Dunner LLP

(57) ABSTRACT

Embodiments of the present invention provide an organic photosensitive optoelectronic device comprising at least one tetra-azaporphyrin compound of formula (I) are disclosed herein.

33 Claims, 1 Drawing Sheet

U.S. PATENT DOCUMENTS

| | | | |
|---|---|---|---|
| 7,230,269 | B2 | 6/2007 | Rand et al. |
| 2003/0215668 | A1* | 11/2003 | Kondakov et al. ............ 428/690 |
| 2005/0226810 | A1* | 10/2005 | Robinson .................... 424/1.11 |
| 2006/0088786 | A1* | 4/2006 | Tamada et al. ........... 430/270.16 |
| 2008/0311304 | A1* | 12/2008 | Thompson et al. ........... 427/402 |
| 2009/0044864 | A1* | 2/2009 | Thompson et al. ........... 136/263 |

FOREIGN PATENT DOCUMENTS

| | | | |
|---|---|---|---|
| GB | 2340658 | A | 2/2000 |
| JP | 09013024 | A * | 1/1997 |
| JP | 2000256575 | A * | 9/2000 |
| WO | WO 94/05025 | A | 3/1994 |
| WO | WO 2004/008554 | A | 1/2004 |
| WO | WO 2004008554 | A2 * | 1/2004 |

OTHER PUBLICATIONS

International Search Report for PCT Application Serial No. PCT/US08/079666, mailed on May 14, 2009.

Brabec, C.J. et al. Origin of the open circuit voltage of plastic solar cells. Advanced Functional Materials, 2001. 11, No. 5, pp. 374-380.

Chizhova, N. V. et al. Synthesis of Palladium and Nickel Complexes with Octaphenyltetraazaporphyrins. Russian Journal of General Chemistry 2003, vol. 73, No. 10, pp. 1645-1647.

Dodelet, et al. Characteristics and behavior of electrodeposited surfactant phthalocyanine photovoltaic cells. Journal of Applied Physics, 1982 American Institute of Physics, pp. 4270-4277.

Fitzgerald, J. et al. Facial Synthesis of Substituted Fumaronitriles and Maleonitriles: Precursors to Soluble Tetraazaporphyrins. Synthesis, 1991, pp. 686-688.

Gledhill, S.E. et al. Organic and nano-structured composite photovoltaics: An overview. Journal of Materials Research, 2005, vol. 20, No. 12, pp. 3167-3179.

International Search Report for PCT Application Serial No. PCT/US08/079666, mailed on Feb. 11, 2009.

Maennig et al. Organic p-i-n solar cells. Applied Physics A: Materials Science & Processing, Springer International, vol. A79, No. 1, 2004, pp. 1-14.

Mutolo, K.L. et al. Enhanced open-circuit voltage in subphthalocyanine/C-60 organic photovoltaic cells. Journal of the American Chemical Society, 2006, 128 (25), pp. 8108-8109.

Peumans P. et al. 2000. American Institute of Physics, "Efficient photon harvesting at high optical intensities in ultrathin organic double-heterostructure photovoltaic diodes". Applied Physics Letters, vol. 76, No. 19, May 8, 2000, pp. 2650-2652.

Peumans, P. et al. Small molecular weight organic thin-film photodetectors and solar cells. Journal of Applied Physics, 2003, vol. 93, No. 7, pp. 3693-3723.

Singh, V.P. et al. Copper-phthalocyanine-based organic solar cells with high open-circuit voltage. Applied Physics Letters 86, 2005, pp. 082106-1 thru 082106-3.

Terao, Y. et al. Correlation of hole mobility, exciton diffusion length, and solar cell characteristics in phthalocyanine/fullerene organic solar cells. Applied Physics Letters 90, 2007 pp. 103515-1 thru 103515-3.

* cited by examiner

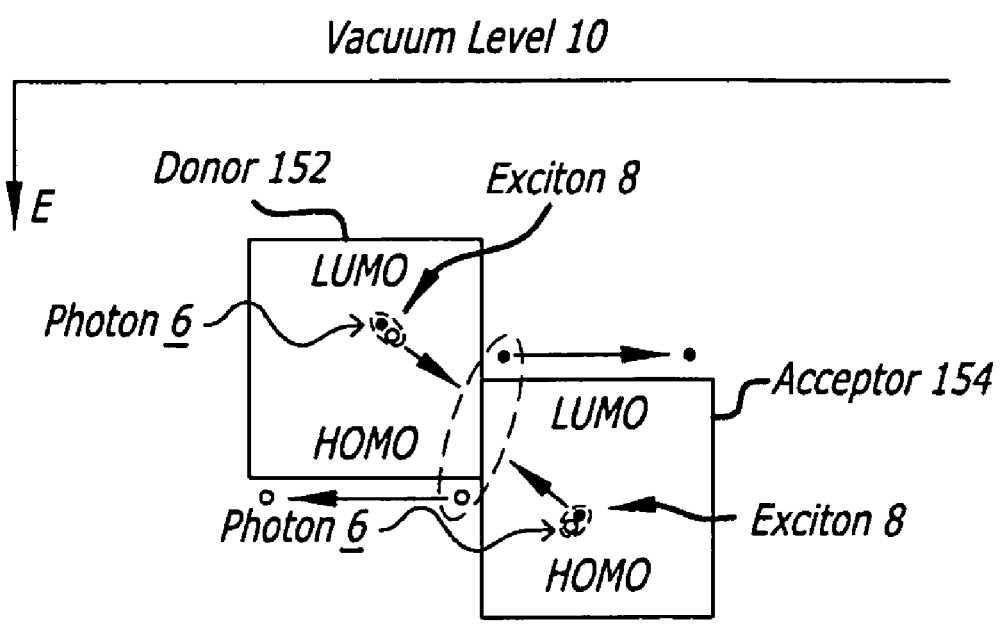

ORGANIC PHOTOSENSITIVE OPTOELECTRONIC DEVICES CONTAINING TETRA-AZAPORPHYRINS

CROSS-REFERENCE TO RELATED APPLICATION(S)

This application is based upon and claims priority to U.S. Provisional Patent Application Ser. No. 60/960,769, entitled "Organic Photosensitive Optoelectronic Devices Containing Tetra-Azaporphyrins," filed Oct. 12, 2007, the entire content of which is incorporated herein by reference.

JOINT RESEARCH AGREEMENT

The claimed invention was made by, on behalf of, and/or in connection with the following parties to a joint university-corporation research agreement: The University of Southern California, The University of Michigan and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices comprising at least one tetra-azaporphyrin compound.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers.

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 dissociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

One common feature of bulk semiconductors, as well as insulators, is a "band gap." The band gap is the energy difference between the highest energy level filled with electrons and the lowest energy level that is empty. In an inorganic semiconductor or inorganic insulator, this energy difference is the difference between the valence band edge (top of the valence band) and the conduction band edge (bottom of the conduction band). In an organic semiconductor or organic insulator, this energy difference is the difference between the HOMO and the LUMO. The band gap of a pure material is devoid of energy states where electrons and holes can exist. The only available carriers for conduction are the electrons and holes which have enough energy to be excited across the band gap. In general, semiconductors have a relatively small band gap in comparison to insulators.

In terms of an energy band model for organic semiconductors, only electrons on the LUMO side of the band gap are charge carriers, and only holes on the HOMO side of the band gap are charge carriers.

Additional background explanation and description of the state of the art for organic photosensitive devices, including their general construction, characteristics, materials, and features, can be found in U.S. Pat. No. 6,657,378 to Forrest et al., U.S. Pat. No. 6,580,027 to Forrest et al., and U.S. Pat. No. 6,352,777 to Bulovic et al., the disclosures of which are incorporated herein by reference.

The performances of small molecular solar cells are determined by studying their characteristic IV responses under dark conditions and under illumination. The power conversion efficiency, ηp, is dependent on the open circuit voltage ($V_{OC}$), the short-circuit current density ($J_{SC}$) and the fill factor (FF) via[1]:

$$\eta_P = \frac{(J_{SC} \times V_{OC} \times FF)}{P_o} \quad (1)$$

where $P_O$ is the incident optical power. Here, FF depends on the series resistance and is typically between 0.5 and 0.65 for high performance small molecular weight organic photovoltaics. The maximum $J_{SC}$, is defined by the overlap between the absorption of the organics. the solar spectrum and the extinction coefficients and thicknesses of the absorbing layers and other factors. However, the photocurrent is highly dependent on the charge transport properties of the materials, since resistivity to charge flow represents a significant challenge to cell performance[2]. Another very important parameter to be considered when referring to cell performance is the exciton diffusion length. The exciton diffusion length of a material represents the distance that an exciton can travel prior to recombination. Accordingly, in order to achieve a high percentage of charge carriers relative to the number of excitons created by absorbed photons the exciton is preferably formed within about $L_D$ of a Heterojunction. The exciton diffusion length, $L_D$, is related to the exciton diffusion coefficient, D, and the exciton lifetime, τ, by the expression: $L_D = \sqrt{D\tau}$ The exciton diffusion length is generally short for organic semiconductors relative to the optical absorption length $L_A$, hence limiting the thickness of the organic layer to be used due to the relatively low ability of the excitons to reach the Donor-Acceptor interface for charge separation. This effect not only restrains the amount of absorbing material but also creates a resistive pathway for separated charge that is undesirable for efficient light conversion[1].

The origin of $V_{OC}$, in organic solar cells is not well understood[3,4]. Some people suggest that it is mainly dependent on the energy difference between the lowest unoccupied molecular orbital (LUMO) of the acceptor-like material and the highest occupied molecular orbital (HOMO) of the donor-like material at the heterointerface in a bilayer cell (referred to as the interface gap, Ig)[5]. However others have observed no evident relation between this Ig and the $V_{OC}$ observed and propose that this voltage is controlled by a chemical potential gradient that would depend on the carrier mobility[6]. Yet, it is clear that the $V_{OC}$ does not reflect the total energy of the photons absorbed and that energy must be lost during the power conversion process. These losses have not been accounted for so far and much care must be taken when assessing the foundations of the open-circuit voltage.

SUMMARY OF THE INVENTION

The present invention provides an organic photosensitive optoelectronic device comprising at least one tetra-azaporphyrin compound of formula I having a trivalent or tetravalent metal atom M bonded at the center of the tetra-azaporphyrin core, wherein M is a (a) trivalent metal atom having a monoamornc ligand, X, attached as shown in formula II, (b) tetravalent metal atom having two monoanionic ligands, X' and X", attached as shown in formula II, or (c) tetravalent metal atom having two monoanionic ligands, X' and X", attached as shown in formula IV:

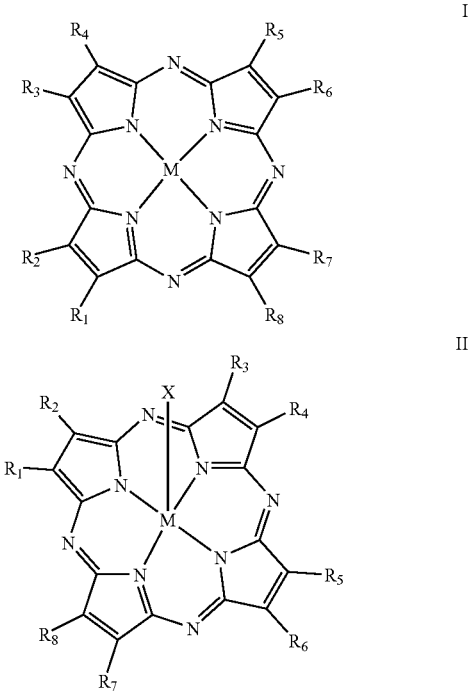

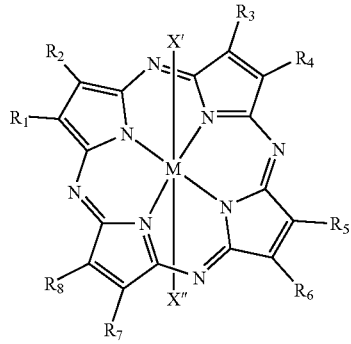

III

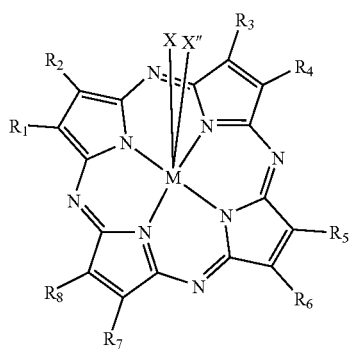

IV wherein

X is a monoanionic ligand;

X' and X" are independently two monoanionic ligands that are the same or different; and $R_1, R_2, R_3, R_4, R_5, R_6, R_7$ and $R_8$ are independently selected from the group consisting of a Cl atom, Br atom, I atom, At atom, and a chemical group comprising a valence atom attached to a β carbon atom of a pyrrole or dihydropyrrole ring of the tetra-azaporphyrin core, wherein the valence atom is selected from the group consisting of B, C, N, O, Si, P, S, Ge, As, Se, In, Sn, Sb, Te, Ti, Pb, Bi and Po, alternatively two adjacent $R_1$-$R_8$ groups attached to two β carbon atoms of the same pyrrole or dihydropyrrole ring together with the two β carbon atoms form a carbocyclic group or heterocyclic group, wherein the carbocyclic or heterocyclic group is monocyclic or multicyclic, with the proviso that the tetra-azaporphyrin compound of formula I is not chloroaluminum phthalocyanine (AlClPc).

In formulae II and IV, the monoanionic ligands X, X' and X" are drawn to be situated above the tetra-azaporphyrin core, but a person skilled in the art would readily understand that the monoanionic ligands X, X' and X" can be situated below the tetra-azaporphyrin core.

The present invention also provides a photosensitive optoelectronic device comprising at least one tetra-azaporphyrin compound of formula I, wherein the at least one tetra-azaporphyrin compound is at least one phthalocyanine compound of formula V having M as defined above in formula I.

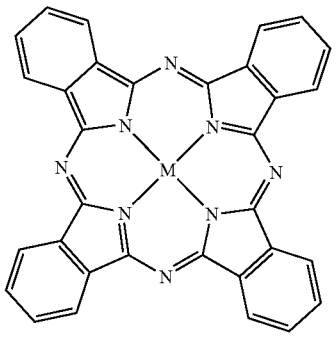

V

The present invention also provides a photosensitive optoelectronic device comprising at least one tetra-azaporphyrin compound of formula I as shown above, wherein the organic photosensitive optoelectronic device comprises
 (i) first electrode and second electrode, wherein at least one of the first electrode and the second electrode is transparent;
 (ii) organic photoactive materials disposed between the first electrode and the second electrode, comprising:
  (a) a first organic semiconductor material; and
  (b) a second organic semiconductor material,
  wherein the first organic semiconductor material comprises at least one donor material relative to the second organic semiconductor material with the second organic semiconductor material comprising at least one acceptor material, or the first organic semiconductor material comprises at least one acceptor material relative to the second organic semiconductor material with the second organic semiconductor material comprising at least one donor material,
  wherein the donor material comprises the at least one tetra-azaporphyrin compound of formula I, and
 (iii) at least one exciton blocking layer between the two electrodes and adjacent to at least one of the two electrodes.

The present invention also provides a method for fabricating the photosensitive optoelectronic device of the present invention, the method comprising providing a donor material and an acceptor material, wherein the donor material and/or the acceptor material comprises at least one tetra-azaporphyrin compound of formula (I) of the present invention; and making the photosensitive optoelectronic device comprising putting the donor material in contact with the acceptor material, wherein when both the donor material and acceptor material comprise at least one tetra-azaporphyrin compound of formula (I), the at least one tetra-azaporphyrin compound in the donor material is different from the at least one tetra-azaporphyrin compound in the acceptor material.

In addition, the present invention provides at least one of the tetra-azaporphyrin compounds of formula (I) useful as at least one component in some or all of the embodiments of the photosensitive optoelectronic devices of the invention.

BRIEF DESCRIPTION OF THE DRAWINGS

FIG. 1 is an energy level diagram illustrating a donor-acceptor heterojunction.

DETAILED DESCRIPTION

The tetra-azaporphyrin compounds described herein may have applications in optoelectronic devices other than organic solar cells. For example, other optoelectronic devices such as organic photodetectors, organic photosensors and organic photoconductors may employ the tetra-azaporphyrin compounds.

The photosensitive optoelectronic devices can be solar cells.

The photosensitive optoelectronic devices can be photodetectors.

The photosensitive optoelectronic devices can be photosensors.

The photosensitive optoelectronic devices can be photoconductors.

As used herein, the term "organic" includes polymeric materials as well as small molecule organic materials that may be used to fabricate organic photosensitive optoelectronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

Examples of the "monoanionic ligand" include halide, pseudo halide, alkyl, aryl, alkoxy, alkenyloxy, alkynyloxy, aralkyloxy, aralkenyloxy, aralkynyloxy, cycloalkylalkoxy, cycloalkylalkenyloxy, cycloalkylalkynyloxy, amido, cycloalkyl, heterocyclyl, heteroaryl, cycloalkoxy, heterocyclyloxy, heteroaryloxy, cycloalkenyloxy, cycloalknyloxy, aralkyloxy, aralkenyloxy, aralkynyloxy, aryloxy, alkylcarbonyloxy, alkenylcarbonyloxy, alkynylcarbonyloxy, hydroxycarbonyloxy or alkoxycarbonyloxy, amino, monoalkyl amino, dialkyl amino, monoaryl amino, diaryl amino, N-alkyl-N'-aryl amino, acyl, acyloxy, nitro, hydroxy, thiol, alkylthio, alkenylthio, alkynylthio, aralkylthio, aralkenylthio, aralkynylthio, cycloalkylalkylthio, cycloalkenylalkylthio, cycloalkynylalkylthio, cycloalkylthio, cycloalkenylthio, cycloalkynylthio and arylthio.

As used herein, "carbocyclic group" means a cyclic chemical group wherein all the ring atoms are carbon. The "carbocyclic group" is monocyclic or multicyclic. The "carbocyclic group" can be a cycloalkyl group, cycloalkenyl group, cycloalkynyl group and aryl group.

As used herein, "heterocyclic group" refers to a cyclic chemical group having at least one N, 0 or S ring atom, with C atom(s) as the remaining ring atom(s). The "heterocyclic group" is monocyclic or multicyclic. When the "heterocyclic group" is aromatic, it is called a "heteroaryl group." The heterocyclic group can be a cyclic group comprising a 4-, 5-, 6-, 7- or 8-membered ring, wherein the ring comprises at least one ring atom selected from the group consisting of N, O and S with C as the remaining ring atom(s). Examples of the heterocyclic group include pyrrolidinyl group, piperidinyl group, piperazinyl group, morpholino group, thiomorpholino group, homopiperidinyl group, chromanyl group, isochromanyl group, chromenyl group, pyrrolyl group, furanyl group, thienyl group, pyrazolyl group, imidazolyl group, finazanyl group, oxazolyl group, isoxazolyl group, thiazolyl group, isothiazolyl group, pyridyl group, pyridazinyl group, pyrimidinyl group, pyrazinyl group, pyranyl group, indolyl group, isoindolyl group, indazolyl group, purinyl group, indolizinyl group, quinolinyl group, isoquinolinyl group, quinazolinyl group, pteridinyl group, quinolizinyl group, benzoxazinyl group, carbazolyl group, phenazinyl group, phenothiazinyl group and phenanthridinyl group.

As used herein, when the term "monocyclic" is used to modify "carbocyclic group" or "heterocyclic group", the carbocyclic group or heterocyclic group comprises only a single ring.

As used herein, when the term "multicyclic" is used to modify "carbocyclic group" or "heterocyclic group", the carbocyclic group or heterocyclic group comprises at least two rings. Examples of "multicyclic" include bicyclic, tricyclic and tetracyclic. Some or all of the rings in the "multicyclic" group can be peri-fused, ortho-fused and/or bridged. The "multicyclic" group can be a spiro group.

As used herein, a "valence atom" of a chemical group refers to the atom of the chemical group that attaches to another chemical group or atom.

As used herein, the term "hydrocarbyl group" refers to a chemical group having carbon and hydrogen atoms.

As used herein, the term "alkyl group" means a straight-chain or branched saturated hydrocarbyl group. Preferably, the "alkyl group" is $C_1$-$C_6$. Examples of the alkyl group include methyl, ethyl, n-propyl, isopropyl, n-butyl, sec-butyl, isobutyl, tert-butyl, n-pentyl and n-hexyl.

As used hereon, the term "alkenyl group" means a hydrocarbyl group comprising at least one C=C double bond. Preferably, the "alkenyl group" is $C_2$-$C_6$. An example of the alkenyl group is vinyl.

As used herein, the term "alkynyl group" means a hydrocarbyl group comprising at least one carbon-to-carbon triple bond. The term. "alkynyl group" includes a chemical group having at least one carbon-to-carbon triple bond and at least one C=C double bond. Preferably, the "alkynyl group" is $C_2$-$C_6$.

As used herein, the term "cycloalkyl group" means a saturated cyclic hydrocarbyl group. The "cycloalkyl group" is monocyclic or multicyclic. The "cycloalkyl group" can be $C_3$-$C_8$. Examples of "cycloalkyl group" include cyclobutyl, cyclopentyl, cyclohexyl, cycloheptyl, cyclooctyl and cyclononyl.

As used herein, the term "cycloalkenyl group" means an unsaturated cyclic hydrocarbyl group having at least one C=C double bond. The "cycloalkenyl group" is monocyclic or multicyclic. The "cycloalkenyl group" can be $C_3$-$C_8$.

As used herein, the term "cycloalkynyl group" means an unsaturated cyclic hydrocarbyl group having at least one carbon-to-carbon triple bond. The "cycloalkynyl group" is monocyclic or multicyclic. The "cycloalkynyl group" can be $C_3$-$C_8$.

As used herein, the term "aryl group" means an aromatic hydrocarbyl group. The "aryl group" is monocyclic or multicyclic. The "aryl group" can be $C_6$-$C_{10}$. Examples of the "aryl group" include phenyl group and naphthyl group.

As used herein, the term "aralkyl group" refers to an alkyl group substituted with at least one aryl group. The aryl portion of the "aralkyl group" can be $C_6$-$C_{10}$. The alkyl portion of the "aralkyl group" can be $C_1$-$C_6$. Example of the "aralkyl group" are benzyl group, i.e., phenylmethyl group, and 2-phenylethyl group.

As used herein, when a chemical group is modified by "substituted" that means the chemical group has at least one hydrogen atom replaced by a substituent. Examples of the substituent include a radical selected from the group consisting of alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino group, amino groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms.

Examples of a substituted alkyl group include an aralkyl group, cycloalkyl substituted alkyl group, cycloalkenyl substituted alkyl group, hydroxyl substituted alkyl group, alkoxy substituted alkyl group, cycloalkoxy substituted alkyl group, aryloxy substituted alkyl group, alkylcarbonyloxy substituted alkyl group, cycloalkylcarbonyloxy substituted alkyl group, cycloalkenylcarbonyloxy substituted alkyl group, cycloalkynylcarbonyloxy substituted alkyl group, arylcarbonyloxy substituted alkyl group, thiol substituted alkyl group, alkylthio substituted alkyl group, cycloalkylthio substituted alkyl group, formyl substituted alkyl group, acylated alkyl group, carbamoyl substituted alkyl group, amino substituted alkyl group, acylamino substituted alkyl group, nitro substituted alkyl group, halogen substituted alkyl group and heterocyclyl substituted alkyl group.

Examples of a substituted alkenyl group include an aralkenyl group, cycloalkenyl substituted alkenyl group, cycloalkenyl substituted alkenyl group, hydroxyl substituted alkenyl group, alkoxy substituted alkenyl group, cycloalkoxy substituted alkenyl group, aryloxy substituted alkenyl group, alkylcarbonyloxy substituted alkenyl group, cycloalkylcarbonyloxy substituted alkenyl group, cycloalkenylcarbonyloxy substituted alkenyl group, cycloalkynylcarbonyloxy substituted alkenyl group, arylcarbonyloxy substituted alkenyl group, thiol substituted alkenyl group, alkylthio substituted alkenyl group, cycloalkylthio substituted alkenyl group, formyl substituted alkenyl group, acylated alkenyl group, carbamoyl substituted alkenyl group, amino substituted alkenyl group, acylamino substituted alkenyl group, nitro substituted alkenyl group, halogen substituted alkenyl group and heterocyclyl substituted alkenyl group.

Examples of a substituted alkynyl group include an aralkynyl group, cycloalkyl substituted alkynyl group, cycloalkenyl substituted alkynyl group, hydroxyl substituted alkynyl group, alkoxy substituted alkynyl group, cycloalkoxy substituted alkynyl group, aryloxy substituted alkynyl group, alkylcarbonyloxy substituted alkynyl group, cycloalkylcarbonyloxy substituted alkynyl group, cycloalkenylcarbonyloxy substituted alkynyl group, cycloalkynylcarbonyloxy substituted alkynyl group, arylcarbonyloxy substituted alkynyl group, thiol substituted alkynyl group, alkylthio substituted alkynyl group, cycloalkylthio substituted alkynyl group, formyl substituted alkynyl group, acylated alkynyl group, carbamoyl substituted alkynyl group, amino substituted alkynyl group, acylamino substituted alkynyl group, nitro substituted alkynyl group, halogen substituted alkynyl group and heterocyclyl substituted alkynyl group.

Examples of a substituted cycloalkyl group include an alkyl substituted cycloalkyl group, aryl substituted cycloalkyl group, cycloalkyl substituted cycloalkyl group, cycloalkenyl substituted cycloalkyl group, cycloalkynyl substituted cycloalkyl group, hydroxyl substituted cycloalkyl group, alkoxy substituted cycloalkyl group, cycloalkoxy substituted cycloalkyl group, aryloxy substituted cycloalkyl group, alkylcarbonyloxy substituted cycloalkyl group, cycloalkylcarbonyloxy substituted cycloalkyl group, cycloalkenylcarbonyloxy substituted cycloalkyl group, cycloalkynylcarbonyloxy substituted cycloalkyl group, arylcarbonyloxy substituted cycloalkyl group, thiol substituted cycloalkyl group, alkylthio substituted cycloalkyl group, cycloalkylthio substituted cycloalkyl group, formyl substituted cycloalkyl group, acylated cycloalkyl group, carbamoyl substituted cycloalkyl group, amino substituted cycloalkyl group, acylamino substituted cycloalkyl group, nitro substituted cycloalkyl group, halogen substituted cycloalkyl group and heterocyclyl substituted cycloalkyl group.

Examples of a substituted cycloalkenyl group include an alkyl substituted cycloalkenyl group, aryl substituted cycloalkenyl group, cycloalkyl substituted cycloalkenyl group, cycloalkenyl substituted cycloalkenyl group, cycloalkynyl substituted cycloalkenyl group, hydroxyl substituted cycloalkenyl group, alkoxy substituted cycloalkenyl group, cycloalkoxy substituted cycloalkenyl group, aryloxy substituted cycloalkenyl group, alkylcarbonyloxy substituted cycloalkenyl group, cycloalkylcarbonyloxy substituted cycloalkenyl group, cycloalkenylcarbonyloxy substituted cycloalkenyl group, cycloalkynylcarbonyloxy substituted cycloalkenyl group, arylcarbonyloxy substituted cycloalkenyl group, thiol substituted cycloalkenyl group, alkylthio substituted cycloalkenyl group, cycloalkylthio substituted cycloalkenyl group, formyl substituted cycloalkenyl group, acylated cycloalkenyl group, carbamoyl substituted cycloalkenyl group, amino substituted cycloalkenyl group, acylamino substituted cycloalkenyl group, nitro substituted cycloalkenyl group, halogen substituted cycloalkenyl group and heterocyclyl substituted cycloalkenyl group.

Examples of a substituted cycloalkynyl group include an alkyl substituted cycloalkynyl group, aryl substituted cycloalkynyl group, cycloalkyl substituted cycloalkynyl group, cycloalkenyl substituted cycloalkynyl group, cycloalkynyl substituted cycloalkynyl group, hydroxyl substituted cycloalkynyl group, alkoxy substituted cycloalkynyl group, cycloalkoxy substituted cycloalkynyl group, aryloxy substituted cycloalkynyl group, alkylcarbonyloxy substituted cycloalkynyl group, cycloalkylcarbonyloxy substituted cycloalkynyl group, cycloalkenylcarbonyloxy substituted cycloalkynyl group, cycloalkynylcarbonyloxy substituted cycloalkynyl group, arylcarbonyloxy substituted cycloalkynyl group, thiol substituted cycloalkynyl group, alkylthio substituted cycloalkynyl group, cycloalkylthio substituted cycloalkynyl group, formyl substituted cycloalkynyl group, acylated cycloalkynyl group, carbamoyl substituted cycloalkynyl group, amino substituted cycloalkynyl group, acylamino substituted cycloalkynyl group, nitro substituted cycloalkynyl group, halogen substituted cycloalkynyl group and heterocyclyl substituted cycloalkynyl group.

Examples of a substituted aryl group include an alkyl substituted aryl group, aryl substituted aryl group, cycloalkyl substituted aryl group, cycloalkenyl substituted aryl group, cycloalkynyl substituted aryl group, hydroxyl substituted aryl group, alkoxy substituted aryl group, cycloalkoxy substituted aryl group, aryloxy substituted aryl group, alkylcarbonyloxy substituted aryl group, cycloalkylcarbonyloxy substituted aryl group, cycloalkenylcarbonyloxy substituted aryl group, cycloalkynylcarbonyloxy substituted aryl group, arylcarbonyloxy substituted aryl group, thiol substituted aryl group, alkylthio substituted aryl group, cycloalkylthio substituted aryl group, formyl substituted aryl group, acylated aryl group, carbamoyl substituted aryl group, amino substituted aryl group, acylamino substituted aryl group, nitro substituted aryl group, halogen substituted aryl group and heterocyclyl substituted aryl group.

Examples of a substituted heterocyclic group include an alkyl substituted heterocyclic group, aryl substituted heterocyclic group, cycloalkyl substituted heterocyclic group, cycloalkenyl substituted heterocyclic group, cycloalkynyl substituted heterocyclic group, hydroxyl substituted heterocyclic group, alkoxy substituted heterocyclic group, cycloalkoxy substituted heterocyclic group, aryloxy substituted heterocyclic group, alkylcarbonyloxy substituted heterocyclic group, cycloalkylcarbonyloxy substituted heterocyclic group, cycloalkenylcarbonyloxy substituted heterocyclic group, cycloalkynylcarbonyloxy substituted heterocyclic group, arylcarbonyloxy substituted heterocyclic group, thiol substituted heterocyclic group, alkylthio substituted heterocyclic group, cycloalkylthio substituted heterocyclic group, formyl substituted heterocyclic group, acylated heterocyclic group, carbamoyl substituted heterocyclic group, amino substituted heterocyclic group, acylamino substituted heterocyclic group, nitro substituted heterocyclic group, halogen substituted heterocyclic group and heterocyclyl substituted heterocyclic group.

In some of the embodiments of the photosensitive optoelectronic device of the present invention, the valence atom in at least one of the $R_1$-$R_8$ groups is a carbon atom.

In some of the embodiments of the photosensitive optoelectronic device of the present invention, the valence atom in at least one of the $R_1$-$R_8$ groups is a carbon atom, wherein at least one of the $R_1$-$R_8$ groups is independently selected from the group consisting of alkyl group, substituted alkyl group, alkenyl group, substituted alkenyl group, alkynyl group, substituted alkynyl group, cycloalkyl group, substituted cycloalkyl group, cycloalkenyl group, substituted cycloalkenyl group, cycloalkynyl group, substituted cycloalkynyl group, aryl group, substituted aryl group, heterocyclic group and substituted heterocyclic group.

In some of the embodiments of the photosensitive optoelectronic device of the present invention, the valence atom in at least one of the $R_1$-$R_8$ groups is a carbon atom, wherein the at least one of the $R_1$-$R_8$ groups is independently selected from the group consisting of alkyl groups, alkenyl groups, alkynyl groups, cycloalkyl groups, cycloalkenyl groups, cycloalkynyl groups, aryl groups and heterocyclic groups.

In some of the embodiments of the photosensitive optoelectronic device of the present invention, the valence atom in at least one of the $R_1$-$R_8$ groups is a carbon atom, wherein the at least one of the $R_1$-$R_8$ groups is independently selected from the group consisting of alkyl groups, substituted alkyl groups, aryl groups or substituted aryl groups.

In some of the embodiments of the photosensitive optoelectronic device of the present invention, the valence atom in at least one of the $R_1$-$R_8$ groups is a carbon atom, wherein the at least one of the $R_1$-$R_8$ groups is independently selected from the group consisting of phenyl group, tolyl group, xylyl group, mesityl group, methyl group, ethyl group, n-propyl group and isopropyl group.

In some of the embodiments of the photosensitive optoelectronic device of the present invention, the valence atoms of two adjacent $R_1$-$R_8$ groups of at least one pyrrole ring are carbon atoms, and wherein the two adjacent $R_1$-$R_8$ groups of the at least one pyrrole ring together with the two β carbon atoms of the at least one pyrrole ring form a carbocyclic group or substituted carbocyclic group.

In some of the embodiments of the photosensitive optoelectronic device of the present invention, the valence atoms of two adjacent $R_1$-$R_8$ groups of at least one pyrrole ring are carbon atoms, and wherein the two adjacent $R_1$-$R_8$ groups of the at least one pyrrole ring together with the two β carbon atoms of the at least one pyrrole ring form a heterocyclic group or substituted heterocyclic group.

In some of the embodiments of the photosensitive optoelectronic device of the present invention, the valence atoms of two adjacent $R_1$-$R_8$ groups of at least one pyrrole ring are carbon atoms, wherein the two adjacent $R_1$-$R_8$ groups of the at least one pyrrole ring together with the two β carbon atoms of the at least one pyrrole ring form a carbocyclic group or substituted carbocyclic group, and the carbocyclic group or substituted carbocyclic group is a macrocycle or benzanulated π-system.

In some of the embodiments of the photosensitive optoelectronic device of the present invention, the valence atoms of two adjacent $R_1$-$R_8$ groups of at least one pyrrole ring are carbon atoms, wherein the two adjacent $R_1$-$R_8$ groups of the at least one pyrrole ring together with the two β carbon atoms of the at least one pyrrole ring form a carbocyclic group or substituted carbocyclic group, and the carbocyclic group or substituted carbocyclic group is aromatic.

In some of the embodiments of the photosensitive optoelectronic device of the present invention, two adjacent $R_1$-$R_8$ groups of at least one pyrrole ring together with the two β carbon atoms of the at least one pyrrole ring form a heterocyclic group or substituted heterocyclic group.

In some of the embodiments of the photosensitive optoelectronic device of the present invention, the valence atom in at least one of the $R_1$-$R_8$ groups is an oxygen atom.

In some of the embodiments of the photosensitive optoelectronic device of the present invention, the valence atom in at least one of the $R_1$-$R_8$ groups is an oxygen atom, wherein the at least one of the $R_1$-$R_8$ groups having O as the valence atom is hydroxy, alkoxy, alkenyloxy, alkynyloxy, cycloakoxy, cycloalkenyloxy, cycloalknyloxy, aralkyloxy, aralkenyloxy, aralkynyloxy, aryloxy, alkylcarbonyloxy, alkenylcarbonyloxy, alkynylcarbonyloxy, hydroxycarbonyloxy or alkoxycarbonyloxy.

In some of the embodiments of the photosensitive optoelectronic device of the present invention, the valence atom in at least one of the $R_1$-$R_8$ groups is an oxygen atom, wherein the at least one of the $R_1$-$R_8$ groups having O as the valence atom is hydroxy or alkoxy.

In some of the embodiments of the photosensitive optoelectronic device of the present invention, the valence atom in at least one of the $R_1$-$R_8$ groups is an oxygen atom, wherein the at least one of the $R_1$-$R_8$ groups having O as the valence atom is hydroxy, methoxy, ethoxy, n-propoxy or isopropoxy.

In some of the embodiments of the photosensitive optoelectronic device of the present invention, at least one of the $R_1$-$R_8$ groups is a Cl atom, Br atom, I atom or At atom.

In some of the embodiments of the photosensitive optoelectronic device of the present invention, the valence atom in at least one of the $R_1$-$R_8$ groups is a nitrogen atom.

In some of the embodiments of the photosensitive optoelectronic device of the present invention, the valence atom in at least one of the $R_1$-$R_8$ groups is a nitrogen atom, wherein the at least one of the $R_1$-$R_8$ groups having N as the valence atom is selected from the group consisting of amino group, alkylamino groups, dialkylamino groups, alkenylamino groups, dialkenylamino groups, alkynylamino groups, dialkynylamino groups, N-alkyl-N-alkenylamino groups, N-alkyl-N-alkynylamino groups, N-alkenyl-N-alkynylamino groups, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups comprising a nitrogen valence atom and substituted heterocyclic groups comprising a nitrogen valence atom.

In some of the embodiments of the photosensitive optoelectronic device of the present invention, the valence atom in at least one of the $R_1$-$R_8$ groups is a sulfur atom.

In some of the embodiments of the photosensitive optoelectronic device of the present invention, the valence atom in at least one of the $R_1$-$R_8$ groups is a sulfur atom, wherein the at least one of the $R_1$-$R_8$ groups is selected from the group consisting of thiol group, alkylthio groups, alkenylthio groups, alkynylthio groups, aralkylthio groups, aralkenylthio groups, aralkynylthio groups, cycloalkylalkylthio groups, cycloalkenylalkylthio groups, cycloalkynylalkylthio groups, cycloalkylthio groups, cycloalkenylthio groups, cycloalkynylthio groups, and arylthio groups.

Examples of M include aluminum, gallium indium, thallium, germanium, tin, lead, arsenic, antimony, bismuth, titanium, vanadium chromium, manganese, iron, cobalt, nickel, zirconium, hafnium, molydenum, tungsten, ruthenium osmium, rhodium, iridium, palladium platinum, silver and gold.

In some of the embodiments of the photosensitive optoelectronic device of the present invention, M is not Al.

In some of the embodiments of the photosensitive optoelectronic device of the present invention, M is Pt, Pd or Ir. Preferably, M is Pt or Pd. More preferably, M is Pt.

In some of the embodiments of the photosensitive optoelectronic device of the present invention, the device is an organic photovoltaic cell.

In some of the embodiments of the photosensitive optoelectronic device of the present invention, the device is a photoconductor cell.

In some of the embodiments of the photosensitive optoelectronic device of the present invention, the device is a photosensor.

In some of the embodiments of the photosensitive optoelectronic device of the present invention, the device is a photodetector.

In some of the embodiments of the photosensitive optoelectronic device of the present invention, the device comprises a donor material and an acceptor material, and wherein the donor material or the acceptor material comprises the at least one tetra-azaporphyrin compound of formula (I). Preferably, the donor material comprises the at least one tetra-azaporphyrin compound of formula (I).

In some of the embodiments of the photosensitive optoelectronic device of the present invention, the device comprises a donor material and an acceptor material, and wherein both the donor material and the acceptor material comprises the at least one tetra-azaporphyrin compound of formula (I), the at least one tetra-azaporphyrin compound in the donor material is different from the at least one tetra-azaporphyrin compound in the acceptor material.

In some of the embodiments of the photosensitive optoelectronic device of the present invention, the device comprises a donor material and an acceptor material, and wherein the donor material comprises the at least one tetra-azaporphyrin compound of formula (I), and the acceptor material comprises a $C_{60}$ compound.

The organic photosensitive optoelectronic device of the present invention can comprises an exciton blocking layer ("EBL"). The exciton blocking nature of a material is not an intrinsic property (see U.S. Pat. No. 6,451,415). Whether a given material will act as an exciton blocker depends upon the relative HOMO and LUMO levels of the adjacent organic photosensitive material. Therefore, it is not possible to identify a class of compounds in isolation as exciton blockers without regard to the device context in which they may be used. However, a person skilled in the art would be able to identify whether a given material will function as an exciton blocker when used with a selected sets of materials to construct an organic photosensitive optoelectronic device. Examples of EBL are described in U.S. patent application Ser. No. 11/150,143 and U.S. Pat. No. 6,451,415 to Forrest et al., which are incorporated herein by reference for the disclosures related to EBLs. For instance, the exciton blocking layer can comprise 2,9-dimethyl-4,7-diphenyl-1,10-phenanthroline (BCP), 4,4',4"-tris{N-(3-methylphenyl)-N-phenylamino}triphenylamine (m-MTDATA) or polyethylene dioxythiophene (PEDOT). Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs reduce quenching by preventing excitons from migrating out of the donor and/or acceptor materials.

The present invention provides a method for fabricating the photosensitive optoelectronic device of the present invention, the method comprising providing a donor material and an acceptor material, wherein the donor material and/or the acceptor material comprises at least one tetra-azaporphyrin compound of formula (I) of the present invention; and making the photosensitive optoelectronic device comprising putting the donor material in contact with the acceptor material, wherein when both the donor material and acceptor material comprise at least one tetra-azaporphyrin compound of formula (I), the at least one tetra-azaporphyrin compound in the donor material is different from the at least one tetra-azaporphyrin compound in the acceptor material.

One of the aspects of the invention concerns a method for fabricating the photosensitive optoelectronic device of the present invention, wherein the photosensitive optoelectronic device is fabricated with any known method of making photosensitive optoelectronic devices, the improvement comprising:

providing a donor material and an acceptor material, wherein the donor material and/or the acceptor material comprises at least one tetra-azaporphyrin compound of formula (I) of the present invention; and putting the donor material in contact with the acceptor material, wherein when both the donor material and acceptor material comprise at least one tetra-azaporphyrin compound of formula (I), the at least one tetra-azaporphyrin compound in the donor material is different from the at least one tetra-azaporphyrin compound in the acceptor material.

In any of the methods for fabricating the photosensitive optoelectronic device of the present invention, the at least one tetra-azaporphyrin compound used in the donor material and/or the acceptor material can be any tetra-azaporphyrin compound of formula (I) disclosed herein.

In some of the embodiments of the methods for fabricating the photosensitive optoelectronic device of the present invention, the photosensitive optoelectronic device is a solar cell.

In some of the embodiments of the methods for fabricating the photosensitive optoelectronic device of the present invention, the photosensitive optoelectronic device is a photodetector.

In some of the embodiments of the methods for fabricating the photosensitive optoelectronic device of the present invention, the photosensitive optoelectronic device is a photosensor.

In some of the embodiments of the methods for fabricating the photosensitive optoelectronic device of the present invention, the photosensitive optoelectronic device is a photoconductor cell.

The tetra-azaporphyrin compound of formula (I) can be prepared with known chemical synthesis methods. For instance, the tetra-azoporphyrin compounds can be synthesized as shown in the reaction scheme below, wherein Ri-R8 are represented by R groups in general.

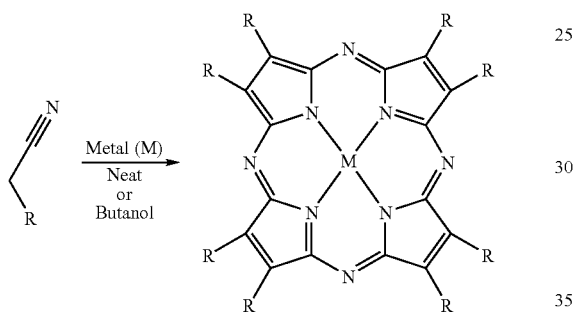

The synthesis of the tetra-azoporphyrins involves the reaction of a metal salt (listed above) with either a fumaronitrile (E) or a maleonitrile (Z) derivative (various R groups) either as a neat reaction or in butanol depending on the R group and the metal salt. The precipitate is then digested in acetic acid and washed or just washed with solvent. Phthalocyanine compounds are synthesized under the same conditions starting with dicyanobenzene derivatives. See, e.g., Mashenkov, V. A. et al. *Zhurnal Prikladnoi Spektroskopii*, 1974, 21(1), 73-81; Fitzgerald, Jeffery et al. *Synthesis,* 1991, 9, 686-688; Chizhova, N. V.; Khelevina, O. G.; Berezin, B. D. *Russian Journal of General Chemistry* 2003, 73(10), 1645-1647.

References
1. Peumans, P., A. Yakimov, and S. R. Forrest, Small molecular weight organic thin-film photodetectors and solar cells. Journal of Applied Physics, 2003. 93(7): p. 3693-3723.
2. Singh, V. P., R. S. Singh, B. Parthasarathy, A. Aguilera, J. Anthony, and M. Payne, Copperphthalocyanine-based organic solar cells with high open-circuit voltage. Applied Physics Letters, 2005. 86(8): p. 082106.
3. Brabec, C. J., A. Cravino, D. Meissner, N. S. Saricifici, T. Fromherz, M. T. Rispens, L. Sanchez, and J. C. Hummelen, Origin of the open circuit voltage of plastic solar cells. Advanced Functional Materials, 2001. 11(5): p. 374-380.
4. Gledhill, S. E., B. Scott, and B. A. Gregg, Organic and nano-structured composite photovoltaics: An overview. Journal of Materials Research, 2005. 20(12): p. 3167-3179.
5. Mutolo, K. L., E. I. Mayo, B. P. Rand, S. R. Forrest, and M. E. Thompson, Enhanced open-circuit voltage in subphthalocyanine/C-60 organic photovoltaic cells. Journal of the American Chemical Society, 2006. 128(25): p. 8108-8109.

Terao, Y., H. Sasabe, and C. Adachi, Correlation of hole mobility, exciton diffusion length, and solar cell characteristics in phthalocyanine/fullerene organic solar cells. Applied Physics Letters, 2007. 90(10): p. 103515.

What is claimed is:

1. An organic photosensitive optoelectronic device comprising at least one tetra-azaporphyrin compound of formula I having a trivalent or tetravalent metal atom M bonded at the center of the tetra-azaporphyrin core, wherein M is a (a) trivalent metal atom having a monoanionic ligand, X, attached as shown in formula II, (b) tetravalent metal atom having two monoanionic ligands, X' and X", attached as shown in formula III, or (c) tetravalent metal atom having two monoanionic ligands, X' and X", attached as shown in formula IV:

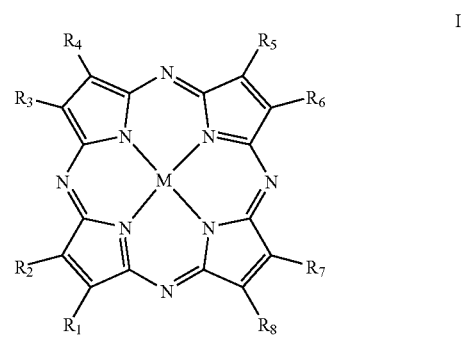

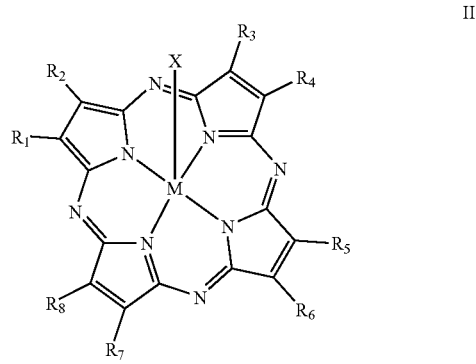

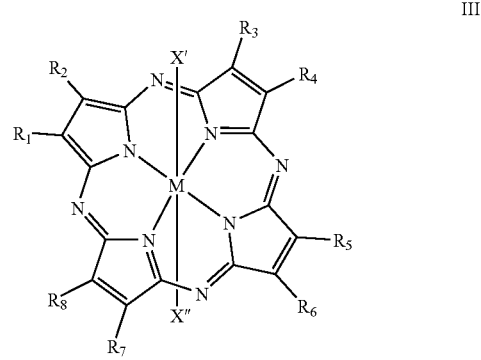

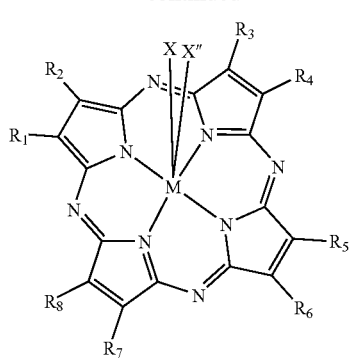

IV wherein
X is a monoanionic ligand;
X' and X" are independently two monoanionic ligands that are the same or different; and
$R_1$, $R_2$, $R_3$, $R_4$, $R_5$, $R_6$, $R_7$ and $R_8$ are independently selected from alkyl group, substituted alkyl group, alkenyl group, substituted alkenyl group, alkynyl group, substituted alkynyl group, cycloalkyl group, substituted cycloalkyl group, cycloalkenyl group, substituted cycloalkenyl group, cycloalkynyl group, substituted cycloalkynyl group, aryl group, substituted aryl group, heterocyclic group and substituted heterocyclic group.

2. The device of claim 1, wherein the valence atom in at least one of the $R_1$-$R_8$ groups is C.

3. The device of claim 2, wherein the at least one of the $R_1$-$R_8$ groups is alkyl, substituted alkyl, aryl or substituted aryl.

4. The device of claim 3, wherein
the substituted alkyl group is an alkyl group substituted with at least one radical independently selected from the group consisting of cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyoloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino group, amino groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;
the substituted alkenyl group is an alkenyl group substituted with at least one radical independently selected from the group consisting of cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyoloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino group, amino groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;
the substituted alkynyl group is an alkynyl group substituted with at least one radical independently selected from the group consisting of cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyoloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino group, amino groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;
the substituted cycloalkyl group is a cycloalkyl group substituted with at least one radical independently selected from the group consisting of alkyl groups, alkenyl groups, alkynyl groups, cycloalkyl groups, cycloalkenyl groups, cycloalkynyl groups, aryl groups, heterocyclic groups, hydroxyl group, alkoxy groups, alkenyloxy groups, alkynyloxy groups, cycloalkoxy groups, cycloalkenyoloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino group, amino groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;
the substituted cycloalkenyl group is a cycloalkenyl group substituted with at least one radical independently selected from the group consisting of alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyoloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino group, amino groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted cycloalkynyl group is a cycloalkynyl group substituted with at least one radical independently selected from the group consisting of alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyoloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino group, amino groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms;

the substituted aryl group is an aryl group substituted with at least one radical independently selected from the group consisting of alkyl groups, alkenyl groups, alkynyl groups, cycloalkyl groups, cycloalkenyl groups, cycloalkynyl groups, aryl groups, heterocyclic groups, hydroxyl group, alkoxy groups, alkenyloxy groups, alkynyloxy groups, cycloalkoxy groups, cycloalkenyoloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino group, amino groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms; and the substituted heterocyclic group is a heterocyclic group substituted with at least one radical independently selected from the group consisting of alkyl groups, alkenyl groups, alkynyl groups, cycloalkyl groups, cycloalkenyl groups, cycloalkynyl groups, aryl groups, heterocyclic groups, hydroxy group, alkoxy groups, alkenyloxy groups, alkynyloxy groups, cycloalkoxy groups, cycloalkenyoloxy groups, cycloalkynyloxy groups, aryloxy groups, alkylcarbonyloxy groups, cycloalkylcarbonyloxy groups, cycloalkenylcarbonyloxy groups, cycloalkynylcarbonyloxy groups, arylcarbonyloxy groups, thiol group, alkylthio groups, cycloalkylthio groups, cycloalkenylthio groups, cycloalkynylthio groups, arylthio groups, formyl group, acyl groups, carbamoyl groups, amino group, amino groups substituted with at least one alkyl group, alkenyl group or alkynyl group, acylamino groups, N-acyl-N-alkyl amino groups, N-acyl-N-alkenyl amino groups, N-acyl-N-alkynyl amino groups, N-acyl-N-cycloalkyl amino groups, N-acyl-N-cycloalkenyl amino groups, N-acyl-N-aryl amino groups, nitro group, heterocyclic groups and halogen atoms.

5. The device of claim 1, wherein at least two of the adjacent $R_1$-$R_8$ groups attached to the same pyrrole or dihydropyrrole ring together with the two β carbon atoms of the pyrrole or dihydropyrrole ring form an optionally substituted carbocyclic or heterocyclic group.

6. The device of claim 5, wherein at least two of the adjacent $R_1$-$R_8$ groups attached to the same pyrrole or dihydropyrrole ring together with the two β carbon atoms of the pyrrole or dihydropyrrole ring form an optionally substituted carbocyclic group.

7. The device of claim 6, wherein the optionally substituted carbocyclic group is an optionally substituted aryl group.

8. The device of claim 7, wherein the optionally substituted aryl group is phenyl or substituted phenyl.

9. The device of claim 8, wherein the at least one tetra-azaporphyrin compound is at least one phthalocyanine compound of formula V having M bonded at the center of the tetra-azaporphyrin core:

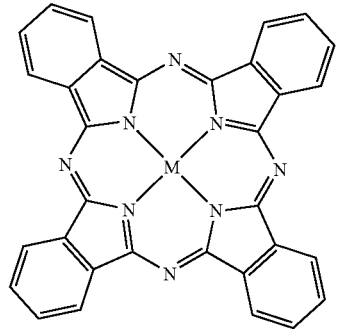

V

10. The device of claim 5, wherein at least two of the adjacent $R_1$-$R_8$ groups attached to the same pyrrole or dihydropyrrole ring together with the two β carbon atoms of the pyrrole or dihydropyrrole ring form a heterocyclic group.

11. The device of claim 6, wherein the optionally substituted carbocyclic group is an optionally substituted macrocycle or benzanulated π-system.

12. The device of claim 1, wherein the valence atom in at least one of the $R_1$-$R_8$ groups is O.

13. The device of claim 12, wherein the at least one of the $R_1$-$R_8$ groups having O as the valence atom is hydroxy, alkoxy, alkenyloxy, alkynyloxy, cycloakoxy, cycloalkenyloxy, cycloalknyloxy, aralkyloxy, aralkenyloxy, aralkynyloxy, aryloxy, alkylcarbonyloxy, alkenylcarbonyloxy, alkynylcarbonyloxy, hydroxycarbonyloxy or alkoxycarbonyloxy.

14. The device of claim 13, wherein the at least one of the $R_1$-$R_8$ groups having O as the valence atom is hydroxy or alkoxy.

15. The device of claim 1, wherein at least one of the $R_1$-$R_8$ groups is independently selected from the group consisting of a Cl atom, Br atom, I atom and At atom.

16. The device of claim 1, wherein at least one of the $R_1$-$R_8$ groups has N as the valence atom.

17. The device of claim 1, wherein at least one of the $R_1$-$R_8$ groups has S as the valence atom.

18. The device of claim 1, wherein X, X' or X" is independently selected from halide, pseudo halide, alkyl, aryl, alkoxy, alkenyloxy, alkynyloxy, aralkyloxy, aralkenyloxy, aralkynyloxy, cycloalkylalkoxy, cycloalkylalkenyloxy, cycloalkylalkynyloxy, amido, cycloalkyl, heterocyclyl, heteroaryl, cycloalkoxy, heterocyclyloxy, heteroaryloxy, cycloalkenyloxy, cycloalknyloxy, aralkyloxy, aralkenyloxy, aralkynyloxy, aryloxy, alkylcarbonyloxy, alkenylcarbonyloxy, alkynylcarbonyloxy, hydroxycarbonyloxy or alkoxycarbonyloxy, amino, monoalkyl amino, dialkyl amino, monoaryl amino, diaryl amino, N-alkyl-N'-aryl amino, acyl, acyloxy, nitro, hydroxy, thiol, alkylthio, alkenylthio, alkynylthio, aralkylthio, aralkenyltho, aralkynylthio, cycloalkylalkylthio, cycloalkenylalkylthio, cycloalkynylalkylthio, cycloalkylthio, cycloalkenylthio, cycloalkynylthio and arylthio.

19. The device of claim 18, wherein X, X' or X" is independently selected from halide, pseudo halide, alkyl, aryl, alkoxy and amido.

20. The device of claim 1, wherein M is selected from the group consisting of aluminum, gallium indium, thallium, germanium, tin, lead, arsenic, antimony, bismuth, titanium, vanadium chromium, manganese, iron, cobalt, nickel, zirconium, hafnium, molydenum, tungsten, ruthenium osmium, rhodium, iridium, palladium platinum, silver and gold.

21. The device of claim 20, wherein M is selected from the group consisting of gallium indium, thallium, germanium, tin, lead, arsenic, antimony, bismuth, titanium, vanadium chromium, manganese, iron, cobalt, nickel, zirconium, hafnium, molydenum, tungsten, ruthenium osmium, rhodium, iridium, palladium platinum, silver and gold.

22. The device of claim 21, wherein M is Pt, Pd or Ir.

23. The device of claim 1, wherein M is a trivalent metal atom.

24. The device of claim 1, wherein M is a tetravalent metal atom.

25. The device of claim 1, comprising
(i) first electrode and second electrode, wherein at least one of the first electrode and the second electrode is transparent;
(ii) organic photoactive materials disposed between the first electrode and the second electrode, comprising:
(a) a first organic semiconductor material; and
(b) a second organic semiconductor material,
wherein the first organic semiconductor material comprises at least one donor material relative to the second organic semiconductor material with the second organic semiconductor material comprising at least one acceptor material, or the first organic semiconductor material comprises at least one acceptor material relative to the second organic semiconductor material with the second organic semiconductor material comprising at least one donor material, wherein the donor material comprises the at least one tetra-azaporphyrin compound of formula I, and wherein the first organic semiconductor material is in direct contact with the second organic semiconductor material; and
(iii) at least one exciton blocking layer between the two electrodes and adjacent to at least one of the two electrodes.

26. The device of claim 1, wherein the device comprises a donor material and an acceptor material, and wherein the donor material comprises the at least one tetra-azaporphyrin compound of formula I.

27. The device of claim 26, wherein the acceptor material comprises $C_{60}$.

28. A method for fabricating an organic photosensitive device of claim 26, comprising
providing a donor material and an acceptor material, wherein the donor material comprises at least one tetra-azaporphyrin compound of formula (I), and
making the organic photosensitive optoelectronic device comprising putting the donor material in contact with the acceptor material.

29. The device of claim 1, wherein the device comprises a donor material and an acceptor material, and wherein the donor material comprises a tetra-azaporphyrin compound of formula (I) and the acceptor material comprises another tetra-azaporphyrin compound of formula (I).

30. The device of claim 1, wherein the device is an organic photovoltaic cell.

31. The device of claim 1, wherein the device is a photoconductor cell.

32. The device of claim 1, wherein the device is a photodetector.

33. The device of claim 1, wherein the device is a photosensor.

* * * * *

UNITED STATES PATENT AND TRADEMARK OFFICE
CERTIFICATE OF CORRECTION

PATENT NO. : 8,158,972 B2  
APPLICATION NO. : 12/249920  
DATED : April 17, 2012  
INVENTOR(S) : Mark E. Thompson et al.

Page 1 of 1

It is certified that error appears in the above-identified patent and that said Letters Patent is hereby corrected as shown below:

Claim 4, col. 18, line 37, "hydroxyl group" should read --hydroxy group--.

Claim 4, col. 19, line 36, "hydroxyl group" should read --hydroxy group--.

Signed and Sealed this
Thirty-first Day of July, 2012

David J. Kappos
*Director of the United States Patent and Trademark Office*